United States Patent
Ledbetter et al.

(10) Patent No.: US 10,274,549 B1
(45) Date of Patent: Apr. 30, 2019

(54) SCALAR ATOMIC MAGNETOMETER WITH HEADING ERROR SUPPRESSION

(71) Applicant: AOSense, Inc., Sunnyvale, CA (US)

(72) Inventors: Micah Ledbetter, Sunnyvale, CA (US); Brian Patton, San Francisco, CA (US)

(73) Assignee: AOSense, Inc., Sunnyvale, CA (US)

( * ) Notice: Subject to any disclaimer, the term of this patent is extended or adjusted under 35 U.S.C. 154(b) by 320 days.

(21) Appl. No.: 15/209,432

(22) Filed: Jul. 13, 2016

(51) Int. Cl.
*G01R 33/26* (2006.01)
*G01N 24/00* (2006.01)

(52) U.S. Cl.
CPC ........... *G01R 33/26* (2013.01); *G01N 24/006* (2013.01)

(58) Field of Classification Search
CPC ...... G01R 33/26; G01R 33/032; G01R 33/24; G01N 24/006
See application file for complete search history.

(56) References Cited

U.S. PATENT DOCUMENTS

| 8,212,556 | B1 | 7/2012 | Schwindt et al. | |
|---|---|---|---|---|
| 8,957,677 | B2 * | 2/2015 | Nagasaka | G01R 33/0322 324/244 |
| 2005/0212607 | A1 * | 9/2005 | Happer | G01R 33/26 331/94.1 |
| 2008/0106261 | A1 * | 5/2008 | Romalis | G01R 33/24 324/304 |
| 2009/0212769 | A1 * | 8/2009 | Stoica | G01R 33/032 324/244.1 |
| 2009/0289629 | A1 * | 11/2009 | Tuchman | G01R 33/032 324/304 |
| 2013/0214780 | A1 * | 8/2013 | Smith | G01N 24/006 324/304 |
| 2016/0061913 | A1 * | 3/2016 | Kobayashi | G01R 33/26 324/305 |
| 2016/0146909 | A1 * | 5/2016 | Kawabata | G01R 33/26 324/304 |

* cited by examiner

*Primary Examiner* — Rishi R Patel
(74) *Attorney, Agent, or Firm* — Van Pelt, Yi & James LLP

(57) ABSTRACT

An atomic magnetometer includes a vapor cell, one or more pumping lasers, a probe laser, and a sensor. The one or more pumping lasers are disposed to direct one or more laser beams though the vapor cell to interact with atoms of an atomic vapor in the vapor cell. The atomic vapor periodically absorbs light of alternating circular polarization from the one or more laser beams. The probe laser is disposed to direct polarized light to pass through the vapor cell. The sensor is disposed to intersect the polarized light from the probe laser after passing through the vapor cell.

21 Claims, 13 Drawing Sheets

SCALAR ATOMIC MAGNETOMETER WITH HEADING ERROR SUPPRESSION

This invention was made with Government support under contract #N68335-14-C-0201 awarded by the US Navy. The Government has certain rights in the invention.

BACKGROUND OF THE INVENTION

Scalar atomic magnetometers are capable of very precisely measuring a magnetic field strength by optically pumping an atomic vapor and measuring the Larmor precession frequency of the atomic spins within the vapor using a probe laser. An ideal scalar atomic magnetometer measures the magnitude of the magnetic field strength without regard to its direction. However, when the pump laser is circularly polarized and not perpendicular to the magnetic field, nonlinear Zeeman shifts cause the atomic vapor resonance to asymmetrically shift, registering as a small shift in the measured magnetic field. This problem is known as heading error, wherein the magnetometer is sensitive to its orientation relative to the direction of the magnetic field. Other effects such as light shifts or phase shifts associated with the relative orientation of the pump and probe beams can also cause spurious heading errors.

BRIEF DESCRIPTION OF THE DRAWINGS

Various embodiments of the invention are disclosed in the following detailed description and the accompanying drawings.

DETAILED DESCRIPTION

Figure 1A:
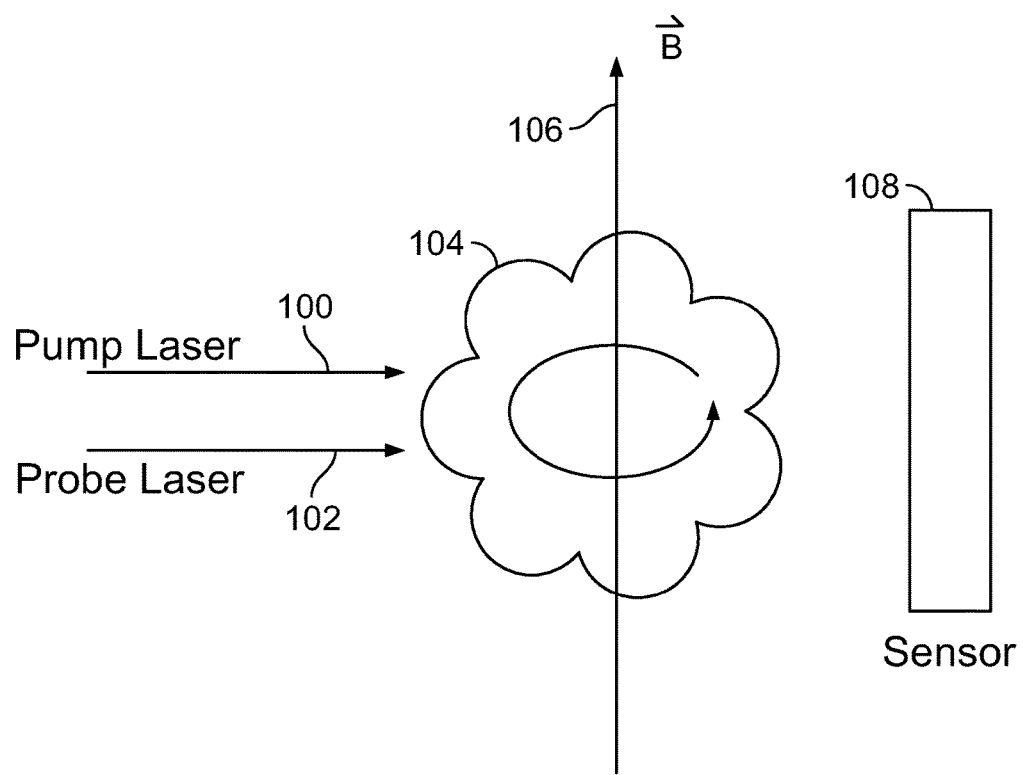
FIG. 1A is a conceptual diagram illustrating an embodiment of a scalar atomic magnetometer.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

An atomic magnetometer is disclosed. The atomic magnetometer comprises a vapor cell, one or more pumping lasers, a probe laser, and a sensor. The one or more pumping lasers are disposed to direct one or more laser beams though the vapor cell to interact with atoms of an atomic vapor in the vapor cell. The atomic vapor periodically absorbs light of alternating circular polarization from the one or more laser beams. The probe laser is disposed to direct polarized light to pass through the vapor cell. The sensor is disposed to intersect the polarized light from the probe laser after passing through the vapor cell.

In various embodiments, the atomic vapor comprises alkali atoms (e.g., typically potassium (K), rubidium (Rb), or cesium (Cs)) and, in some cases a buffer gas (e.g., typically some mixture of helium (He), nitrogen gas ($N_2$), or neon (Ne)), or any other appropriate vapor. In some embodiments, the atomic vapor comprises metastable Helium. In some embodiments, the vapor cell has an antirelaxation coating instead of a buffer gas. In some embodiments, the one or more pumping lasers are modulated in optical intensity, detuning, or polarization at a known frequency, such that their interaction with the atoms in the vapor cell is likewise modulated in a periodic fashion. Successive interactions (e.g., in some cases referred to as "pulses" herein) between the one or more pumping lasers and the atoms exhibit alternating circular polarization of the laser(s). In various embodiments, the probe laser produces polarized light that passes through the vapor cell, wherein the average propagation vectors of the probe laser and the one or more pump lasers are nominally parallel or antiparallel or at any other appropriate angle (e.g., perpendicular). In various embodiments, the pumping laser(s) and/or the probe laser(s) are pulsed lasers, are continuous lasers, or any other appropriate combination of continuous and pulsed lasers.

Heading error in a scalar atomic magnetometer is typically caused in part by the nonlinear Zeeman effect, which leads to multiple magnetic resonances within the atomic vapor which may or may not be fully resolved. The weights of these resonances change as a function of the relative orientation of the incident light and the magnetic field, leading to a shift in the weighted average of the overall magnetic-resonance spectrum. In some embodiments, this heading error is minimized by pumping the atomic vapor using pulses of alternating-handedness of circularly polarized light (e.g., alternating between right-handed polarization and left-handed polarization (i.e., the opposite polarization)). The two polarization directions have mirror-image asymmetrical resonance spectra, so when these mirrored spectra are combined, the result is a symmetrical resonance spectrum whose center does not change as the angle between the incident light and the magnetic field through the atomic vapor shifts.

In some embodiments, a second source of error in scalar atomic magnetometers is AC Stark shifts, also known as light shifts. These appear as a shift in the magnetic-resonance frequency produced not by a real magnetic field, but by the light used to pump or probe the atoms. The effective spurious magnetic field caused by a monochromatic light source is an odd function of its detuning from the atomic optical transition. The magnitude of the effective magnetic field (which contributes to the reading of an atomic magnetometer) is maximum near the optical transition frequency but decreases rapidly with detuning from the transition. In order to reduce the effects of light shifts, the pump laser frequency is modulated by an amount greater than the optical transition's (e.g., a D1 optical transition) optical absorption width. The pump laser frequency is modulated at half the Larmor precession frequency $V_L$. Once per Larmor precession period (twice per modulation period), the light from either circularly polarized pump beam is on resonance with the optical transition (e.g., a D1 or D2 optical transition in K, Rb, or Cs). The D1 transition is generally preferable because it leads to less power broadening of the ground state Zeeman resonance.). Since the light shift has the opposite sign on either side of the optical transition, they are effectively time-averaged to a negligible level if the central frequency of the laser is equal to the transition frequency.

FIG. 1A is a conceptual diagram illustrating an embodiment of a scalar atomic magnetometer. In some embodiments, a scalar atomic magnetometer comprises a measurement device for measuring the magnitude of a magnetic field using atomic interactions. In the example shown, pump laser 100 and probe laser 102 are directed at atomic vapor 104. In some embodiments, atomic vapor 104 comprises an atomic vapor cell. In some embodiments, atomic vapor 104 comprises a vapor of alkali metal atoms (e.g., lithium, sodium, potassium, rubidium, cesium, francium, etc.). In some embodiments, an atomic vapor cell comprises a container holding atoms in a vapor (e.g., atoms dispersed in a cloud within the volume of the cell using heating). In some embodiments, pump laser 100 comprises a laser producing frequency modulated light with circular polarization. In some embodiments, pump laser 100 produces pulses at a pulse modulation frequency (e.g., a frequency determined by the inverse of the period of time between pulses). In some embodiments, the central frequency of the pump laser comprises a frequency chosen to be resonant with an optical transition of the atoms of the atomic vapor 104. While the intensity of the light of either pump beam need not be modulated during this process, the effective optical pumping rate of the light is modulated, resulting in "pulses" of optical pumping light. In some embodiments, a pump beam generated by a pump laser is amplitude modulated. Upon stimulation by the circularly polarized light of pump laser 100, the atomic spin polarization of atomic vapor 104 precesses about the magnetic field at the Larmor precession frequency. The Larmor precession frequency depends on the strength of magnetic field 106 passing through atomic vapor 104 according to $v_L=\gamma B$, where $v_L$ is the Larmor precession frequency, $\gamma$ is the gyromagnetic ratio for the atomic species of atomic vapor 104, and B is the magnetic field strength. In some embodiments, pump laser 100 comprises a pump laser system—for example, a system that includes a push-pull pumping scheme wherein pulses are produced at twice the Larmor precession frequency, alternating circular polarization direction (e.g., pulses in the positive circular polarization direction are produced at the Larmor precession frequency and pulses in the negative circular polarization direction are produced at the Larmor precession frequency and the two pulse trains are 180 degrees out of phase). Probe laser 102 comprises a probe, wherein probe laser 102 is for probing atomic vapor 104. In some embodiments, probe laser 102 produces linearly polarized laser light. In some embodiments, light produced by probe laser 102 interacts with atoms of atomic vapor 104 and emerges from atomic vapor 104 with its polarization rotated by an amount dependent on the projection of atomic spin polarization of atomic vapor 104 along the probe beam within their Larmor precession cycle. In some embodiments, the atomic vapor experiences and periodically absorbs light of alternating polarization (e.g., circular) from one or more pump lasers. In some embodiments, light from probe laser 102 emerges from atomic vapor 104 with its polarization modulated at the Larmor precession frequency of atoms of atomic vapor 104. Sensor 108 comprises a sensor for measuring light from probe laser 102 emerging from atomic vapor 104. In some embodiments, sensor 108 comprises a sensor for measuring the polarization of light from probe laser 102 emerging from atomic vapor 104. In some embodiments, sensor 108 comprises a probe beam polarization detector. In some embodiments, sensor 108 comprises a polarizing beam splitter and a first photodiode for measuring a first beam of a first polarization out of the polarizing beam splitter and a second photodiode for measuring a second beam of orthogonal polarization out of the polarizing beam splitter. In some embodiments, a polarization measurement is based at least in part on the difference between a measurement of a first photodiode and a second photodiode measuring two polarization states of a probe beam after it has passed through a vapor cell. In some embodiments, pump laser 100 and probe laser 102 produce light whose direction of propagation is nominally parallel.

In some embodiments, in the event the scalar atomic magnetometer of FIG. 1A is rotated so that the direction of pump laser 100 is parallel to the direction of magnetic field 106, the signal of the atomic magnetometer falls to zero (e.g., probe laser 102 is not rotated by the atoms of atomic vapor 104). In order to measure magnetic fields of any direction, two magnetometers are used (e.g., the magnetometer comprises a first atomic magnetometer and a second atomic magnetometer, wherein the pump laser light of the second atomic magnetometer propagates in a direction perpendicular to the pump laser light of the first atomic magnetometer, wherein the second magnetometer may be comprised of a separate vapor cell and the same or a separate set of lasers; in cases where the cell contains a buffer gas, diffusion is suppressed; this enables the possibility of forming the second magnetometer by illuminating a spatially distinct region of the cell with beams propagating in an orthogonal direction to the first set of beams).

Figure 1B:
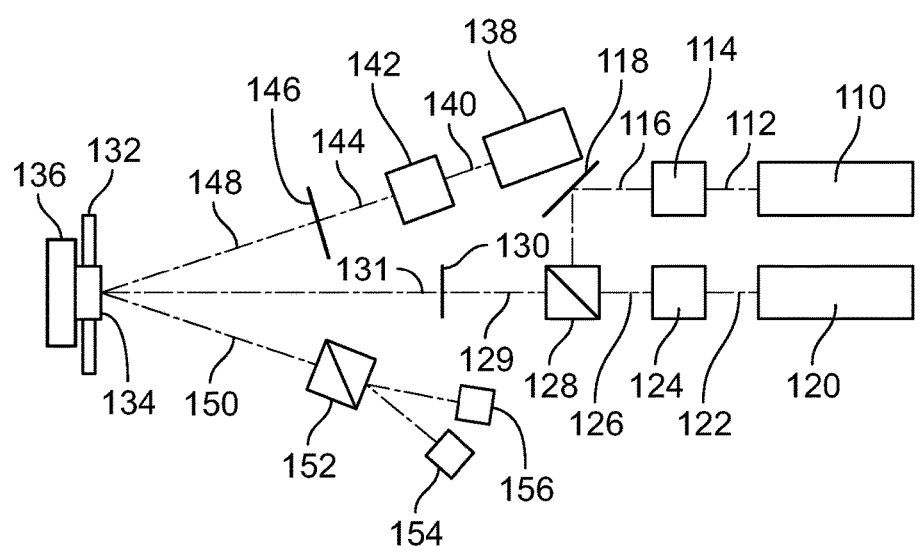
FIG. 1B is a diagram illustrating an embodiment of a magnetometer.

FIG. 1B is a diagram illustrating an embodiment of a magnetometer. In some embodiments, the magnetometer of FIG. 1B is used to implement the magnetometer of FIG. 1A. In the example shown, pump laser 110 (e.g., a vertical cavity surface emitting laser) generates beam 112 and is disposed to direct beam 112 to optics 114 (e.g., collimating optics to take diverging beam from pump laser to form collimated beam 116), which is reflected using mirror 118, that is disposed to direct collimated beam 116 to polarizing beam splitter 128. Pump laser 120 (e.g., a vertical cavity surface emitting laser) generates beam 122 and is disposed to direct beam 122 to optics 124 (e.g., collimating optics to take diverging beam from pump laser to form collimated beam 126) which is/are disposed to direct collimated beam 126 to polarizing beam splitter 128. Polarizing beam splitter 128 is disposed to combine collimated beam 116 from pump laser 110 and collimated beam 126 from pump laser 120 to generate beam 129 that is passed through quarter waveplate 130 (e.g., to generate circularly polarized light from linearly polarized light). Beam 131 generated after passing through quarter waveplate 130 is incident on vapor cell 134. Beam 131 reflects off of mirror 136 to interact twice with atoms of an atomic vapor in vapor cell 134. Heater 132 is used to heat atoms in vapor cell to create and maintain the atomic vapor in vapor cell 134.

In some embodiments, a measurement is taken using probe laser 138 (e.g., a vertical cavity surface emitting laser). Probe laser 138 is disposed to generate beam 140 that is shaped using optics 142 (e.g., collimated from a diverging beam, beam 140, to collimated beam 144). Collimated beam 144 is passed through linear polarizer 146 to generate a linearly polarized beam 148 that is disposed to pass through vapor cell 134 and reflect off of mirror 136 to propagate as beam 150 toward beam splitter 152 and measured using detector 156 and detector 154. Beam splitter 152 separates polarization components of beam 150 and enables a determination of polarization of beam 150 using detector 154 (e.g., a photodiode) and detector 156 (e.g., a photodiode).

Figure 1C:
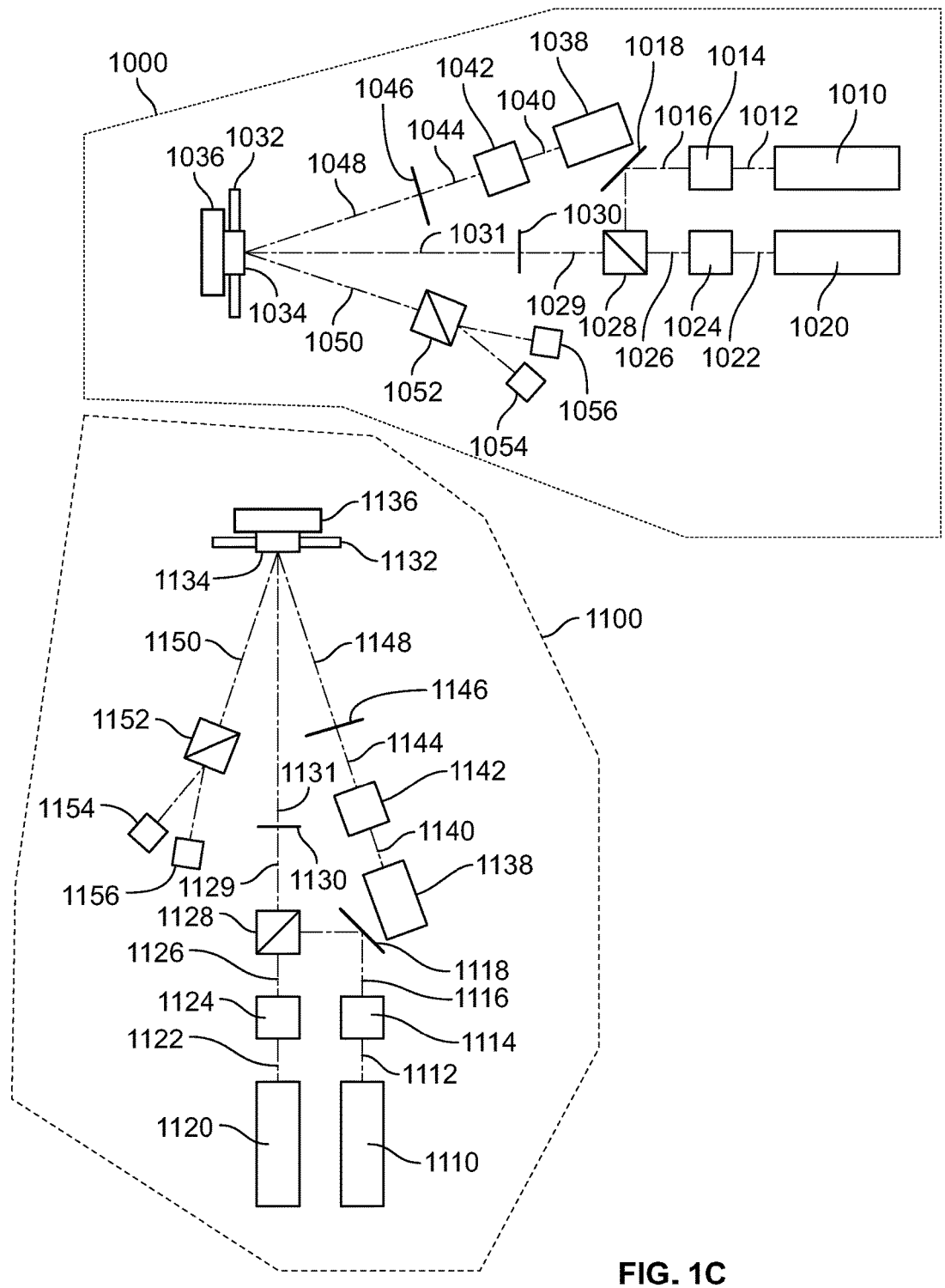
FIG. 1C is a diagram illustrating an embodiment of a dual magnetometer.

FIG. 1C is a diagram illustrating an embodiment of a dual magnetometer. In some embodiments, each of the dual magnetometers is an implementation of a magnetometer of FIG. 1A. In some embodiments, two vapor cells are included to eliminate dead zones by forming independent magnetometers. In some embodiments, a similar instrument eliminating dead zones is achieved using a single, larger, vapor cell with independent beams propagating at orthogonal angles through the vapor cell. For each magnetometer, the two modulated pump beams are delivered as linearly polarized light along orthogonal axes of the same fiber and then converted to circularly polarized light by a quarter waveplate. In the example shown, first magnetometer 1000 and second magnetometer 1100 have vapor cell 1034 and vapor cell 1134, respectively, that are disposed orthogonally to each other and disposed to be addressed with pump lasers that have propagating beams in orthogonal directions. In the example shown, first magnetometer 1000 includes pump laser 1010 (e.g., a vertical cavity surface emitting laser) that generates beam 1012 and is disposed to direct beam 1012 to optics 1014 (e.g., collimating optics to take diverging beam from pump laser to form collimated beam 1016), which is reflected using mirror 1018, that is disposed to direct collimated beam 1016 to polarizing beam splitter 1028. Pump laser 1020 (e.g., a vertical cavity surface emitting laser) generates beam 1022 and is disposed to direct beam 1022 to optics 1024 (e.g., collimating optics to take diverging beam from pump laser to form collimated beam 1026) which is/are disposed to direct collimated beam 1026 to polarizing beam splitter 1028. Polarizing beam splitter 1028 is disposed to combine collimated beam 1016 from pump laser 1010 and collimated beam 1026 from pump laser 1020 to generate beam 1029 that is passed through quarter waveplate 1030 (e.g., to generate circularly polarized light from linearly polarized light). Beam 1031 generated after passing through quarter waveplate 1030 is incident on vapor cell 1034. Beam 1031 reflects off of mirror 1036 to interact twice with atoms of an atomic vapor in vapor cell 1034. Heater 1032 is used to heat atoms in vapor cell to create and maintain the atomic vapor in vapor cell 1034.

In some embodiments, a measurement is taken using probe laser 1038 (e.g., a vertical cavity surface emitting laser). Probe laser 1038 is disposed to generate beam 1040 that is shaped using optics 1042 (e.g., collimated from a diverging beam, beam 1040, to collimated beam 1044). Collimated beam 1044 is passed through linear polarizer 1046 to generate a linearly polarized beam 1048 that is disposed to pass through vapor cell 1034 and reflect off of mirror 1036 to propagate as beam 1050 toward beam splitter 1052 and measured using detector 1056 and detector 1054. Beam splitter 1052 separates polarization components of beam 1050 and enables a determination of polarization of beam 1050 using detector 1054 (e.g., a photodiode) and detector 1056 (e.g., a photodiode).

In some embodiments, second magnetometer 1100 includes pump laser 1110 (e.g., a vertical cavity surface emitting laser) that generates beam 1112 and is disposed to direct beam 1112 to optics 1114 (e.g., collimating optics to take diverging beam from pump laser to form collimated beam 1116), which is reflected using mirror 1118, that is disposed to direct collimated beam 1116 to polarizing beam splitter 1128. Pump laser 1120 (e.g., a vertical cavity surface emitting laser) generates beam 1122 and is disposed to direct beam 1122 to optics 1124 (e.g., collimating optics to take diverging beam from pump laser to form collimated beam 1126) which is/are disposed to direct collimated beam 1126 to polarizing beam splitter 1128. Polarizing beam splitter 1128 is disposed to combine collimated beam 1116 from pump laser 1110 and collimated beam 1126 from pump laser 1120 to generate beam 1129 that is passed through quarter wave plate 1130 (e.g., to generate circularly polarized light from linearly polarized light). Beam 1131 generated after passing through quarter wave plate 1130 is incident on vapor cell 1134. Beam 1131 reflects off of mirror 1136 to interact twice with atoms of an atomic vapor in vapor cell 1134. Heater 1132 is used to heat atoms in vapor cell to create and maintain the atomic vapor in vapor cell 1134.

In some embodiments, a measurement is taken using probe laser 1138 (e.g., a vertical cavity surface emitting laser). Probe laser 1138 is disposed to generate beam 1140 that is shaped using optics 1142 (e.g., collimated from a diverging beam, beam 1140, to collimated beam 1144). Collimated beam 1144 is passed through linear polarizer 1146 to generate a linearly polarized beam 1148 that is disposed to pass through vapor cell 1134 and reflect off of mirror 1136 to propagate as beam 1150 toward beam splitter 1152 and measured using detector 1156 and detector 1154. Beam splitter 1152 separates polarization components of beam 1150 and enables a determination of polarization of beam 1150 using detector 1154 (e.g., a photodiode) and detector 1156 (e.g., a photodiode).

Figure 1D:
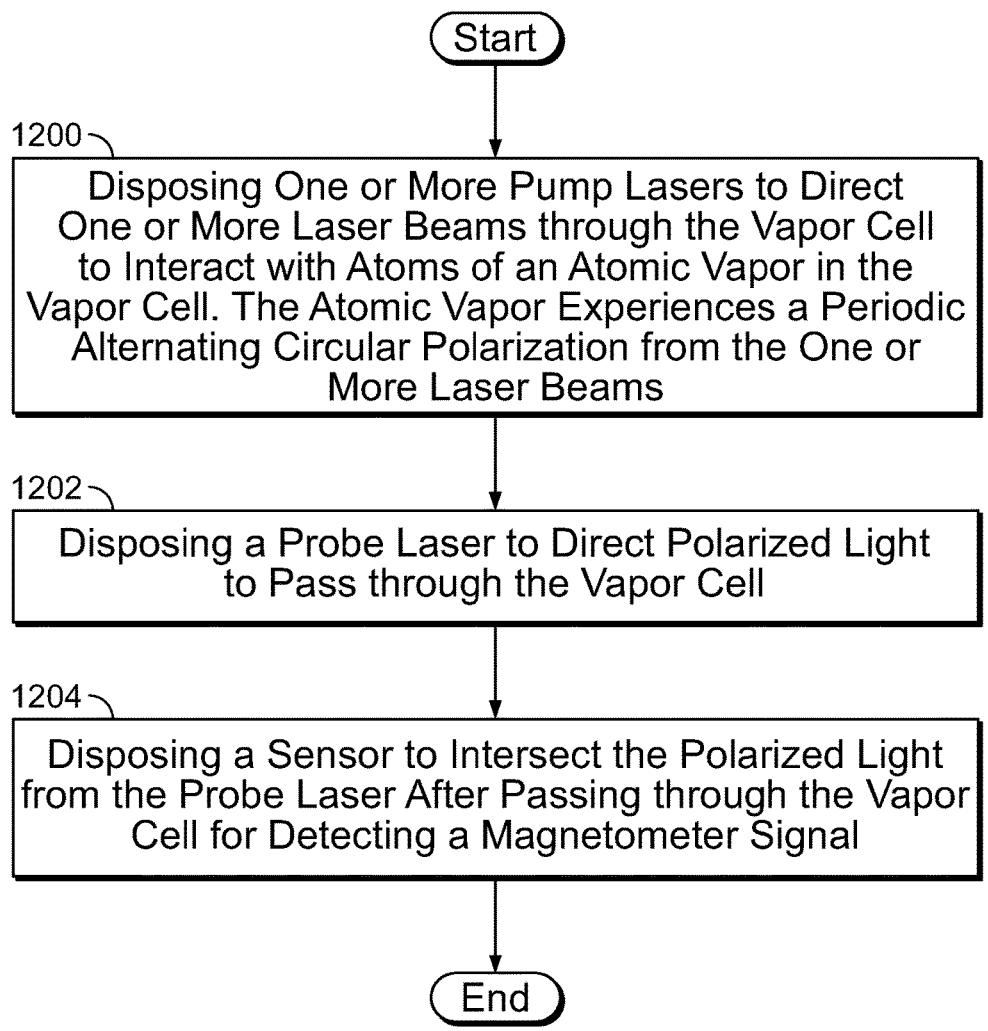
FIG. 1D is a flow diagram illustrating an embodiment of a method for an atomic magnetometer.

FIG. 1D is a flow diagram illustrating an embodiment of a method for an atomic magnetometer. In some embodiments, the process of FIG. 1D is used with a magnetometer of FIG. 1A. In the example shown, in 1200 one or more pump lasers is disposed to direct one or more laser beams through the vapor cell to interact with atoms of an atomic vapor in the vapor cell. The atomic vapor periodically absorbs photons of alternating circular polarization from the one or more laser beams. For example, the one or more pump lasers are modulated and combined to interact with the atoms of the atomic vapor in the vapor cell. The one or more pump laser deliver alternating circularly polarized light to the atoms of the atomic vapor of the vapor cell. In some embodiments, the light from either laser beam is always on and always of a specified polarization. In some embodiments, the periodic absorption of photons from either laser beam is modulated via frequency modulation of the light. In some embodiments, the intensity of either beam is modulated to achieve delivery of the alternating of the polarized light to the atoms of the vapor cell. The one or more pump lasers also dither the center frequency of the optical frequency enabling a feedback loop to operate by detecting signals at the dither rate and its harmonics. In various embodiments, the pump laser beams are amplitude, polarization, or frequency modulated. In some embodiments, a pump laser beam passes through the vapor cell twice by reflecting off a mirror after traversing through the vapor cell. In 1202, a probe laser is disposed to direct light to pass through the vapor cell. For example, a probe laser is positioned or arranged to direct its light through the vapor cell and then measured using photodetectors. In some embodiments, the probe laser passes through the vapor cell twice by reflecting off a mirror after traversing through the vapor cell. In various embodiments, a pump laser beam is parallel, anti-parallel, orthogonal, at a skewed angle, at a shallow angle, or any other appropriate angle to a probe laser. In 1204, a sensor is disposed to intersect the polarized light from the probe laser after passing through the vapor cell for detecting a magnetometer signal. For example, the probe laser beam reflects off of the mirror after passing through the vapor and is positioned such that the probe laser beam strikes a sensor comprising one or more detectors that is/are able to measure the probe laser beam (e.g., a polarization of the probe laser beam—for example, using a measurement of two orthogonal polarizations of the probe laser beam).

Figure 1E:
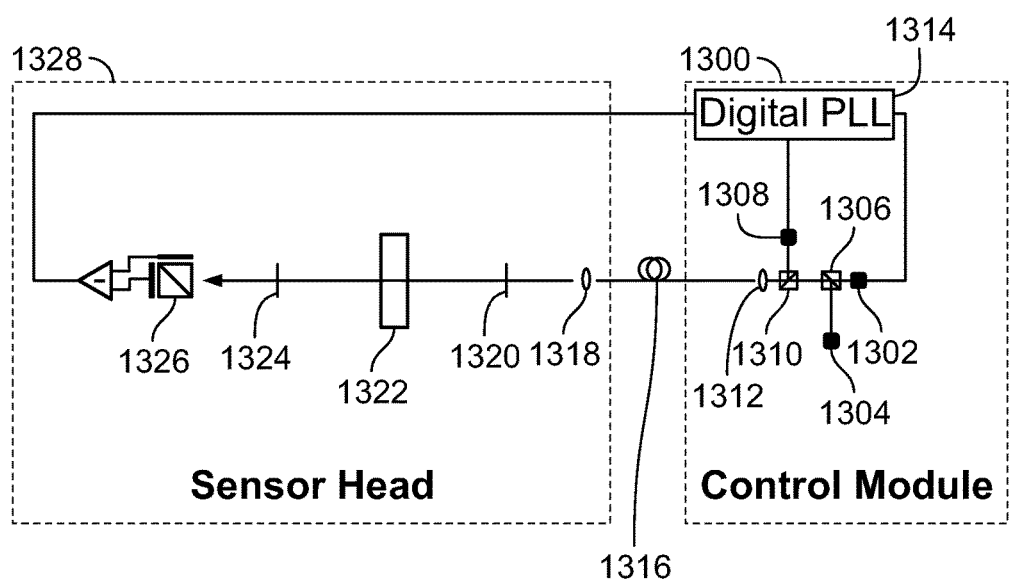
FIG. 1E is a block diagram illustrating an embodiment of an atomic magnetometer.

FIG. 1E is a block diagram illustrating an embodiment of an atomic magnetometer. In some embodiments, the magnetometer of FIG. 1E is used to implement the magnetometer of FIG. 1A. In the example shown, a scalar magnetometer with suppressed heading error due to light shifts and nonlinear Zeeman effect comprises control module 1300, fiber 1316, and sensor head 1328. Control module 1300 comprises pump laser 1302 and pump laser 1308 that are modulated using signals generated by digital phase lock loop (PLL) 1314. The modulated pump beams from pump laser 1302 and pump laser 1308 are combined together with probe laser 1304 using beam splitter 1306 and beam splitter 1310. The combined beams (e.g., beams from pump laser 1302, pump laser 1308, and probe laser 1304) are launched into fiber 1316 using coupling optics 1312 (e.g., lens, positioner, etc.) with polarization vectors of the combined beams aligned along the fast and slow axes of fiber 1312. The central frequency of the pump beams (e.g., beams from pump laser 1302 and pump laser 1308) are tuned to a first transition of atoms in vapor cell 1322 (e.g., the D1 transition of the relevant alkali). An unmodulated probe beam (e.g., beam generated by probe laser 1304) tuned to the wing of a second transition (e.g., off resonance of the D2 transition—for example, about 50 GHz off resonance) is combined with the two pump beams and launched into the fiber along its fast or slow axis. On sensor head 1328 the beams are collimated with lens 1318 and passed through multi-order waveplate 1320. Multi-order waveplate 1320 is configured so that it acts as a quarter waveplate for the first transition light of the pump laser beams (e.g., D1 light of pump laser 1302 and pump laser 1308), and a half waveplate for the second transition light (e.g., D2 light of probe laser 1304). This converts the orthogonal linearly polarized pump beams to orthogonal circular polarizations, while leaving the probe beam linearly polarized. Pump and probe beams propagate through vapor cell 1322. Interference filter 1324 filters out the pump light, leaving the probe light to pass through to sensor 1326 (e.g., a balanced polarimeter for detection of a magnetometer signal). Signals from sensor 1326 are fed back to digital PLL 1314 for closed loop detection. In the example shown, beams from pump laser 1302, pump laser 1308, and probe laser 1304 propagate in parallel through vapor cell 1322 in a single pass.

Figure 2:
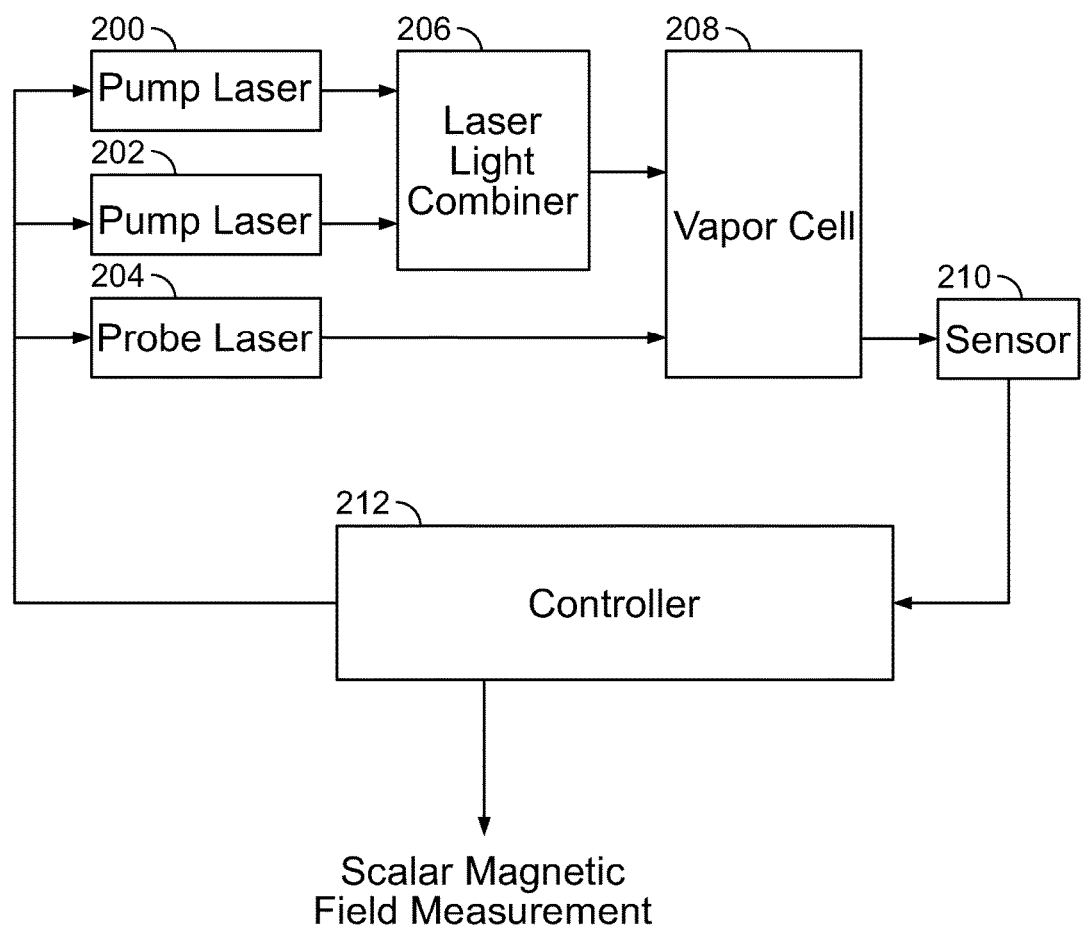
FIG. 2 is a block diagram illustrating an embodiment of an atomic magnetometer.

FIG. 2 is a block diagram illustrating an embodiment of an atomic magnetometer. In some embodiments, the atomic magnetometer of FIG. 2 comprises the atomic magnetometer of FIG. 1. In the example shown, the atomic magnetometer of FIG. 2 comprises pump laser 200 and pump laser 202. In some embodiments, pump laser 200 produces light pulses with positive circular polarization and pump laser 202 produces light with negative circular polarization. In some embodiments, pump laser 200 and pump laser 202 produce linearly polarized light. In some embodiments, pump laser 200 and pump laser 202 produce light pulses at the same pulse modulation frequency. In some embodiments, pump laser 200 and pump laser 202 produce pulses of optical pumping light out of phase with one another (e.g., pump laser 200 and pump laser 202 alternately produce pulses). In various embodiments, pump laser 200 and pump laser 202 comprise vertical-cavity surface-emitting lasers (e.g., VCSELs), external-cavity diode lasers, distributed feedback lasers, or any other appropriate laser technology. In the example shown, light from pump laser 200 and from pump laser 202 are combined by laser light combiner 206. In some embodiments, laser light combiner 206 comprises a polarizing beam splitter. In some embodiments, laser light combiner 206 produces light as though from a single laser. In some embodiments, a single laser performs the function of both pump laser 200 and pump laser 202 (e.g., producing light of alternating circular polarization—for example, using a modulator to modulate polarization) and laser light combiner 206 is not necessary. In some embodiments, laser light combiner 206 additionally comprises a quarter-wave plate for converting linearly polarized light to circularly polarized light. Light from laser light combiner 206 illuminates vapor cell 208. In some embodiments, the light from laser light combiner 206 is transmitted to vapor cell 208 via optical fiber; in such cases additional polarization optics may be used at the fiber input and output, and the fiber may or may not be a polarization-maintaining optical fiber. When the modulation frequency of the light corresponds to a harmonic or subharmonic of the Larmor precession frequency, synchronous optical pumping drives a macroscopic atomic spin magnetization which precesses about the magnetic field at the Larmor frequency. Frequency modulation of the light at half the Larmor precession frequency, $v_{L/2}$ is advantageous because it suppresses the effects of light shifts, as discussed above. In some embodiments, vapor cell 208 comprises an atomic vapor and an inert buffer gas. In some embodiments, the net atomic spin projection within vapor cell 208 precesses at the Larmor frequency. Probe laser 204 comprises a laser for producing linearly polarized light for probing vapor cell 208. In some embodiments, the light from probe laser 204 is transmitted to the cell via optical fiber. Light from probe laser 204 emerges from vapor cell 208 and is measured by sensor 210. In some embodiments, sensor 210 comprises a sensor for measuring a polarization direction. In some embodiments, sensor 210 produces a signal related to the oscillation of atoms within vapor cell 208. In some embodiments, the probe beam exiting vapor cell 208 is resolved into its constituent polarization components which are transmitted to sensor 210 via separate optical fibers. Controller 212 receives a measurement from sensor 210 and produces control signals for pump laser 200, pump laser 202, and probe laser 204, as well as providing a scalar magnetic field measurement. In some embodiments, controller 212 comprises a feedback controller. In some embodiments, controller 212 adjusts the pulse modulation frequency of pump laser 200 and pump laser 202 until the pulse modulation frequency is locked to the Larmor frequency or a subharmonic thereof. In some embodiments, controller 212 determines an in-phase component and an out-of-phase component of the signal received from sensor 210 and changes the pulse modulation frequency until the determined out-of-phase component is zero. In some embodiments, controller 212 comprises a phase-locked loop circuit. In some embodiments, the controller determines that the magnetic field is linearly related to the lock-in frequency divided by the gyromagnetic ratio of the atoms of the vapor cell.

In some embodiments, the signal is digitized by a fast analog-to-digital converter (ADC) and analyzed via field programmable gate array (FPGA) circuitry using a digital lock-in amplifier algorithm: let $s(t)=x(v_m)\cos(4\pi v_m t)+y(v_m)\sin(4\pi v_m t)$. Multiply by $\cos(4\pi v_m t)$ and $\sin(4\pi v_m t)$ and integrate over some duration $T \gg 1/v_m$ to obtain the in-phase and out-of-phase components of the signal:

$$x(v_m) = \frac{1}{2T} \int_{\tau=t}^{t+T} \cos(4\pi v_m \tau)s(\tau)d\tau$$

$$y(v_m) = \frac{1}{2T} \int_{\tau=t}^{t+T} \sin(4\pi v_m \tau)s(\tau)d\tau.$$

Assuming homogeneous broadening of the magnetic resonance, the in-phase and out-of-phase components of the resonance have the form:

$$x(v_m) = a \frac{\Delta v^2}{(v_m - v_L/2)^2 + \Delta v^2}$$

$$y(v_m) = a \frac{\Delta v(v_m - v_L/2)}{(v_m - v_L/2)^2 + \Delta v^2}.$$

Here, $\Delta v$ is the half-width at half-max of the power broadened ground state Zeeman resonance, equal to the distance from the center of the resonance to the extrema of the out-of-phase component.

In some embodiments, the out-of-phase component y has a dispersive profile and crosses zero when the modulation frequency $$v_m = \frac{1}{2} v_L$$

and can be used as the error signal to lock the modulation frequency to the Larmor precession frequency. The FPGA updates the frequency synthesizer output to maintain the condition $y(v_m)=0$. The magnetic field is related to the modulation frequency via $v_m=\gamma B/2$, where $\gamma$ is the gyromagnetic ratio of the alkali species, a constant of nature (for $^{87}$Rb $\gamma=700$ kHz/G). The relative phase offset between the probe rotation signal and the pump laser modulation is nominally constrained by the pump/probe geometry, but quadrature demodulation of the magnetic-resonance signal allows both x and y to be extracted from the data, providing redundant information for the detection of spurious phase offsets.

In some embodiments, electronic phase shifts may vary with temperature and frequency and could cause spurious errors in the magnetic field reading in a simple feedback algorithm wherein the control loop changes $v_m$ to null $y(v_m)$. To calibrate such shifts, the digital circuitry can dither the modulation frequency at some frequency (e.g., a dithering frequency—$v_{dither}$) that is slow compared to the inverse of the integration time T. If the electronic phase shifts are nonzero, there is modulation of the quantity $x^2+y^2$ (e.g., a sum of the squared values of the signals from the different quadratures) at the first harmonic of $v_{dither}$. This error signal can be used to tune the phase shifts to zero for any given operating condition. In essence, this method locks the magnetometer to the maximum magnitude of optical rotation and corrects the demodulation phase to ensure that the signals $x(v_m)$ and $y(v_m)$ are purely absorptive and dispersive resonances, respectively. In this case, the quadrature signal $y(v_m)$ crosses zero exactly when $v_m$ is equal to half the Larmor precession frequency, $v_L/2$.

Figure 3:
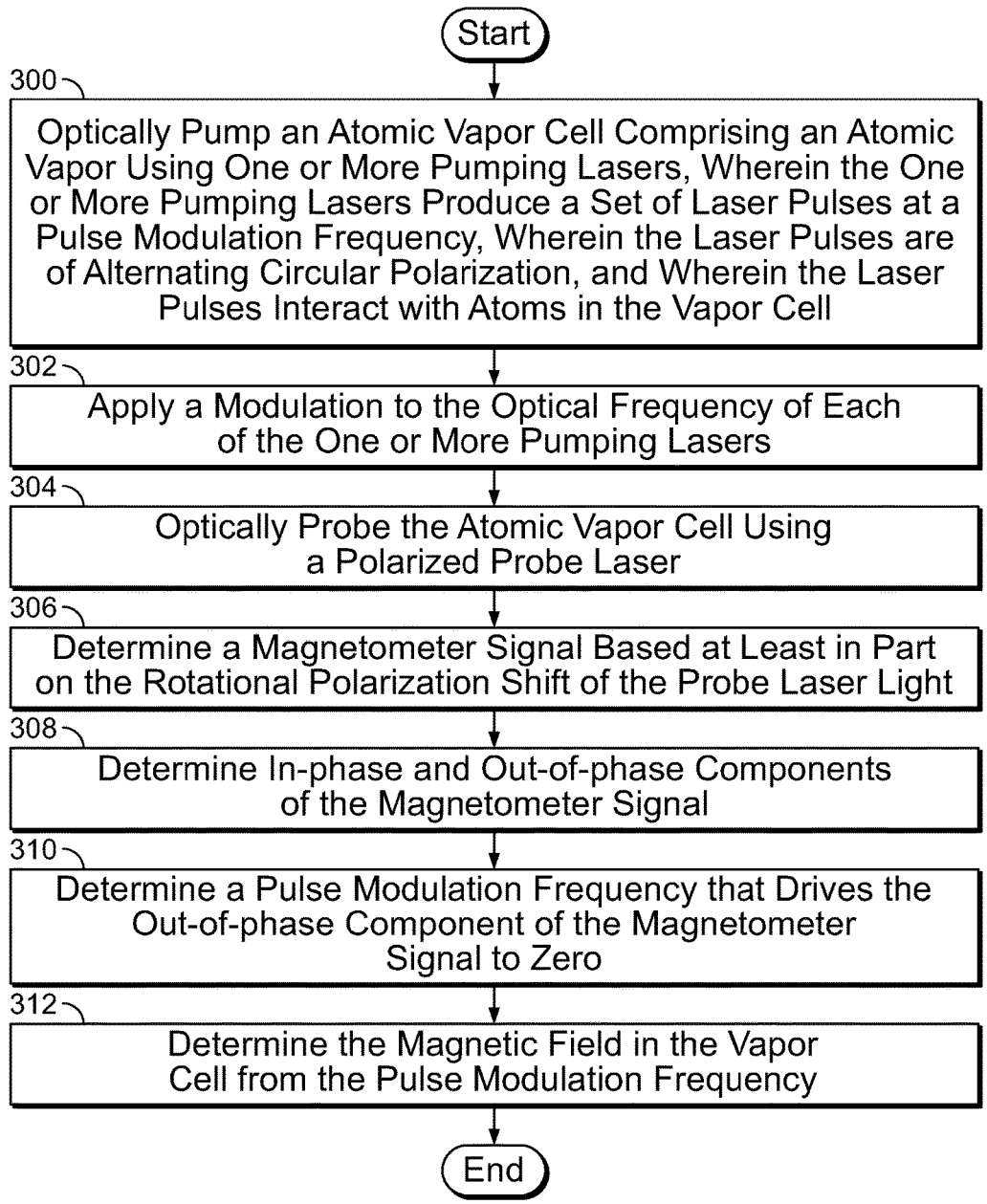
FIG. 3 is a flow diagram illustrating an embodiment of a process for an atomic magnetometer.

FIG. 3 is a flow diagram illustrating an embodiment of a process for an atomic magnetometer. In some embodiments, the process of FIG. 3 is executed by the atomic magnetometer of FIG. 2. In the example shown, in 300, an atomic vapor cell comprising an atomic vapor is optically pumped using one or more pumping lasers, wherein the one or more pumping lasers produce a set of laser pulses at a pulse modulation frequency, wherein the laser pulses are of alternating circular polarization, and wherein the laser pulses interact with atoms in the vapor cell. In 302, a modulation is applied to the optical frequency of each of the one or more pumping lasers. For example, a modulation is applied to the optical frequency, thereby modulating the detuning of each pump laser from the optical resonance of the atomic vapor. In 304, the atomic vapor cell is optically probed using a polarized probe laser. In 306, a magnetometer signal is determined based, at least in part, on the phase of the polarization rotation of the probe laser light with respect to the modulation of the pump light. In 308, in-phase and out-of-phase components of the magnetometer signal are determined. In 310, a pulse modulation frequency is determined that drives the out-of-phase component of the magnetometer signal to zero. In 312, the magnetic field in the vapor cell is determined from the pulse modulation frequency (e.g., the pulse modulation frequency determined in 310).

Figure 4:
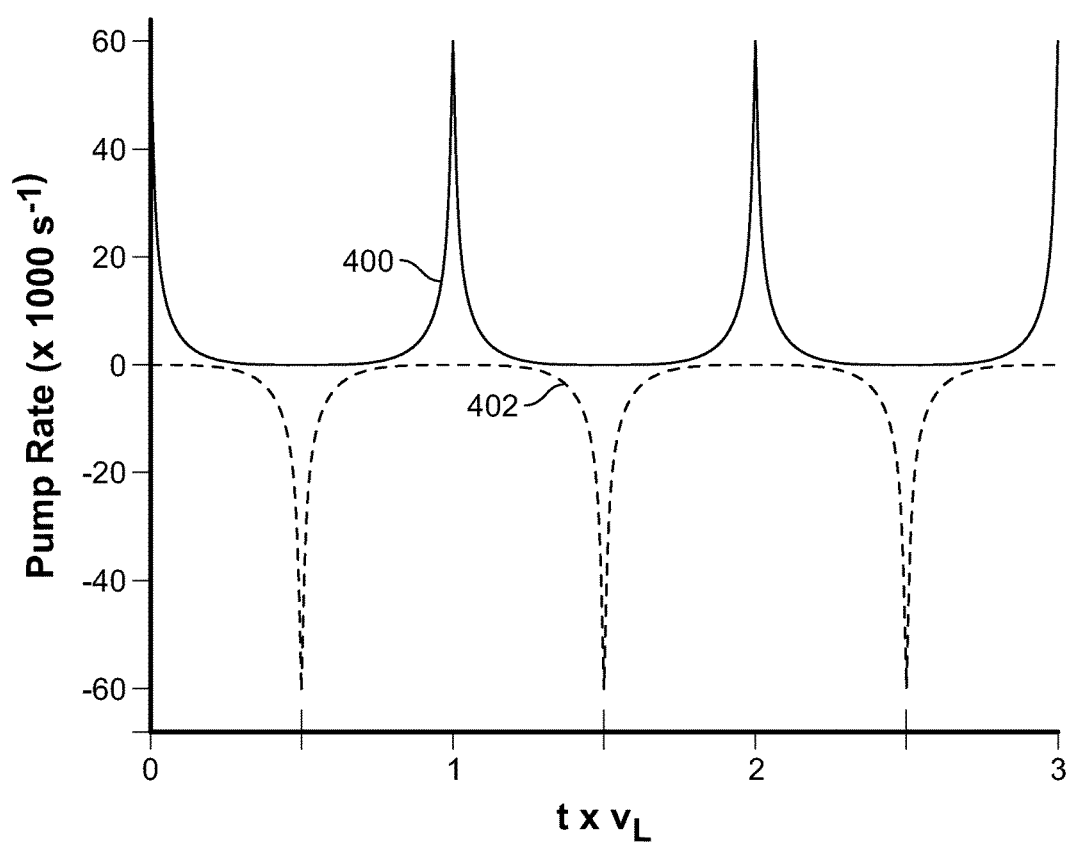
FIG. 4 is a diagram illustrating an embodiment of optical pumping rate for two different circularly polarized pump laser beams as a function of time.

FIG. 4 is a diagram illustrating an embodiment of optical pumping rate. In some embodiments, the graph of FIG. 4 represents the optical pumping rate emitted by a pair of pump lasers (e.g., pump laser 200 of FIG. 2 and pump laser 202 of FIG. 2). In the example shown, solid line 400 represents the optical pumping rate generated by a first pump laser and dashed line 402 represents the optical pumping rate generated by a second pump laser. In some embodiments, a single laser is used for push-pull pumping and generates optical pumping rate indicated by the sum of solid line 400 and dashed line 402. In the example shown, the pulse period of each optical pumping pulse train (e.g., of the positive pulse train and of the negative pulse train) is equal to the Larmor precession period, resulting in an overall pulse train with a periodicity equal to half the Larmor precession period.

Figure 5A:
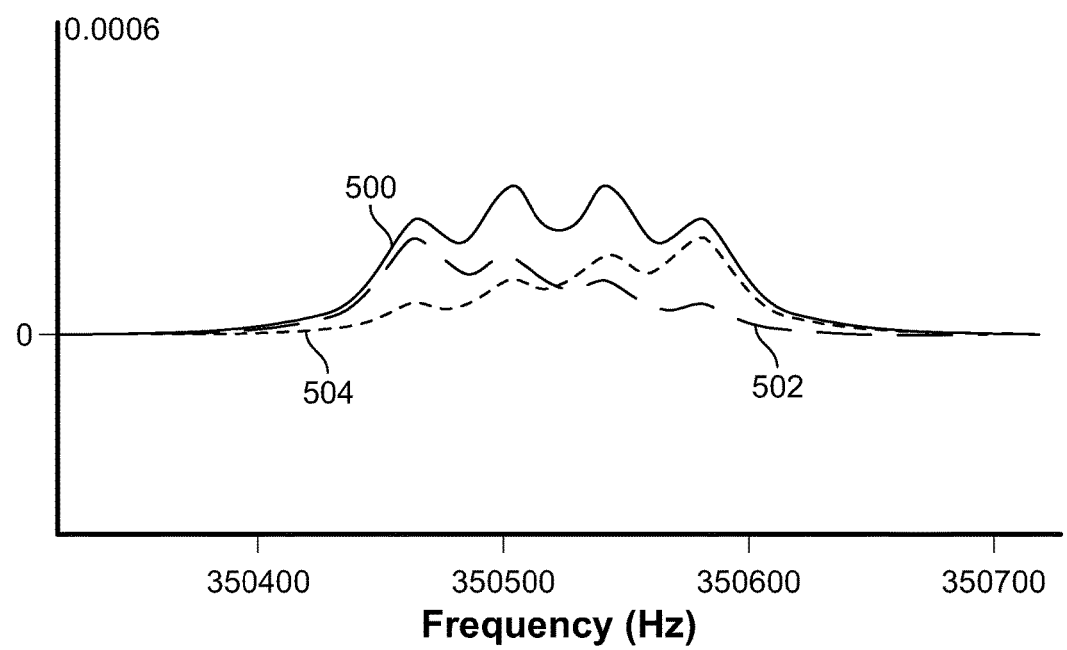
FIG. 5A is a diagram illustrating an embodiment of atomic vapor magnetic resonance spectra.

FIG. 5A is a diagram illustrating an embodiment of atomic vapor magnetic resonance spectra. In the example shown, solid line 500 represents the magnetic resonance of an atomic vapor in response to single-ended optical pumping (defined here as optical pumping with pulses of only a single circular polarization, e.g., according to solid line 400 of FIG. 4) using light perpendicular to the magnetic field direction. Broad dashed line 502 represents the magnetic resonance of an atomic vapor in response to single-ended optical pumping at +45 degrees with respect to the magnetic field and narrow dashed line 504 represents the magnetic resonance of an atomic vapor in response to single-ended optical pumping at −45 degrees with respect to the magnetic field. The resonance is skewed asymmetrically as the direction of the pump laser departs from a perpendicular orientation with respect to the magnetic field. The shift in the resonance corresponds to a shift in the measured Larmor precession frequency and thus a shift in the measured magnetic field. In some embodiments, in the event the opposite single-ended optical pumping were used (e.g., according to dashed line 402 of FIG. 4 instead of solid line 400 of FIG. 4), the asymmetries of broad dashed line 502 and narrow dashed line 504 would be switched (e.g., pumping at +45 degrees would result in the resonance shown by narrow dashed line 504 and pumping at −45 degrees would result in the resonance shown by broad dashed line 502).

Figure 5B:
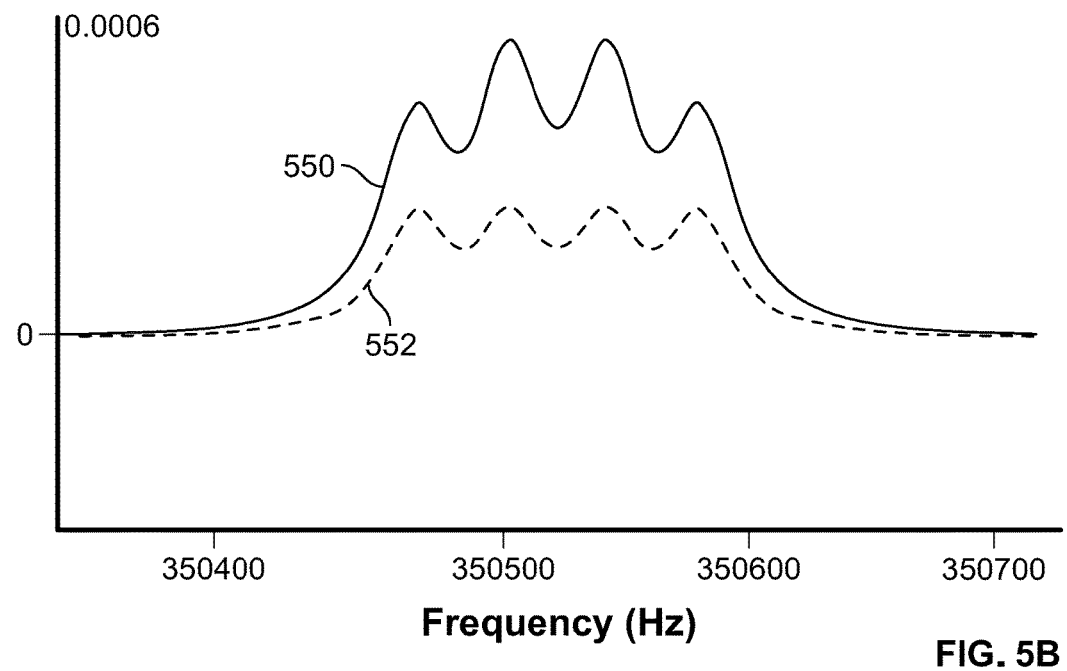
FIG. 5B is a diagram illustrating an embodiment of atomic vapor magnetic resonance spectra.

FIG. 5B is a diagram illustrating an embodiment of atomic vapor magnetic resonance spectra. In the example shown, solid line 550 represents the magnetic resonance of an atomic vapor in response to push-pull optical pumping (e.g., using pulses of alternating circular polarization, e.g., according to a combination of solid line 400 of FIG. 4 and dashed line 402 of FIG. 4) using light perpendicular to the magnetic field direction. The resonance is seen to be the same as using single ended pumping (e.g., solid line 500 of FIG. 5A) but with a higher peak because the net optical pumping power is higher. Dashed line 552 represents the magnetic resonance of an atomic vapor in response to push-pull optical pumping using light at either +45 degrees to the magnetic field direction or −45 degrees to the magnetic field direction. Pumping using a first polarization causes the resonance to shift in a first direction (e.g. according to broad dashed line 502 of FIG. 5A) and pumping using an opposite polarization causes the resonance to shift in the opposite direction (e.g. according to narrow dashed line 504 of FIG. 5A), thus pumping using both polarizations causes the resonance to shift in a symmetrical way representing the combination of the two mirror-image asymmetries. The center of the resonance, corresponding to the measured magnetic field magnitude, is thus independent of the orientation of the magnetic field with respect to the pump beam.

Figure 6A:
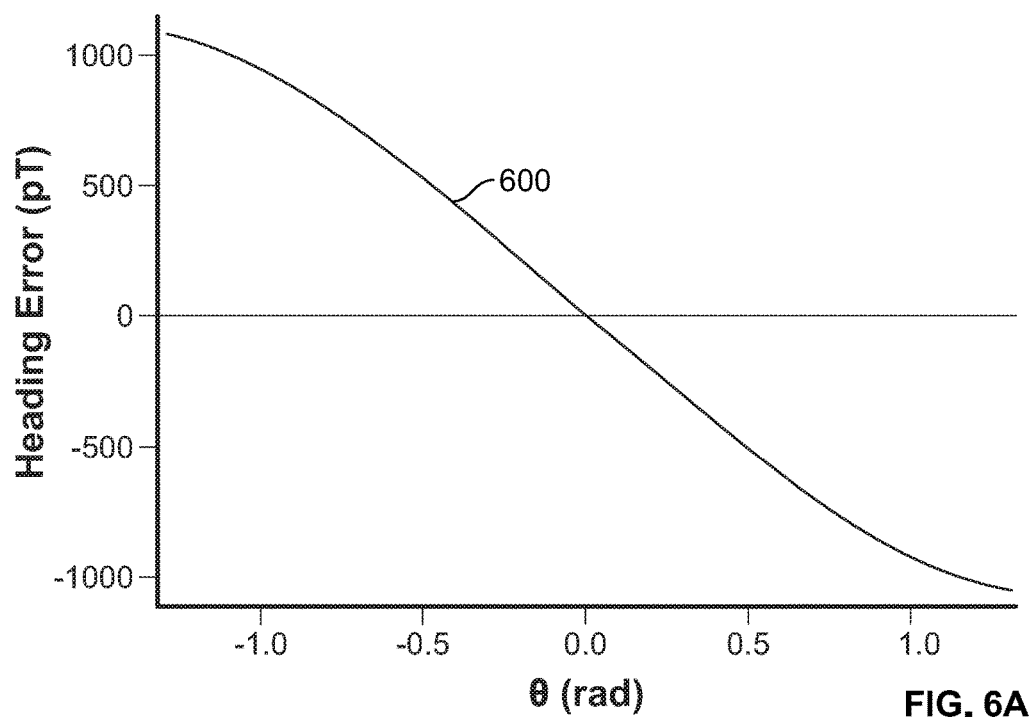
FIG. 6A is a diagram illustrating heading error as a result of nonlinear Zeeman effect for a scalar atomic magnetometer using a single circularly polarized pump beam.

FIG. 6A is a diagram illustrating heading error as a result of nonlinear Zeeman effect for a scalar atomic magnetometer using a single circularly polarized pump beam. In the example shown, solid line 600 represents heading error as a result of nonlinear Zeeman effect. For a heading offset of 45 degrees (e.g., $\pi/4=1.57$ radians) the heading error is over 1000 pT.

Figure 6B:
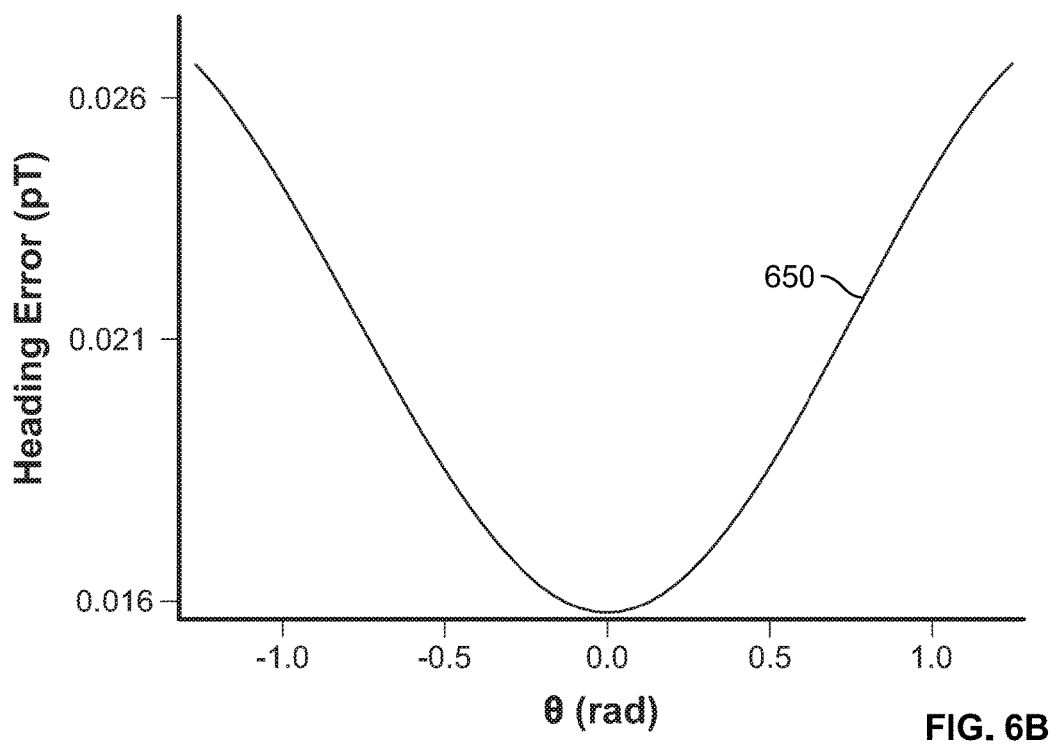
FIG. 6B is a diagram illustrating heading error as a result of nonlinear Zeeman effect for an atomic magnetometer using push-pull optical pumping.

FIG. 6B is a diagram illustrating heading error as a result of nonlinear Zeeman effect for an atomic magnetometer using push-pull optical pumping. In the example shown, solid line 650 represents heading error as a result of nonlinear Zeeman effect. For a heading offset of 45 degrees (e.g., $\pi/4=1.57$ radians) the heading error is less than 0.3 pT, a reduction of 3.5 orders of magnitude compared with the single-ended optical pumping result.

Figure 7:
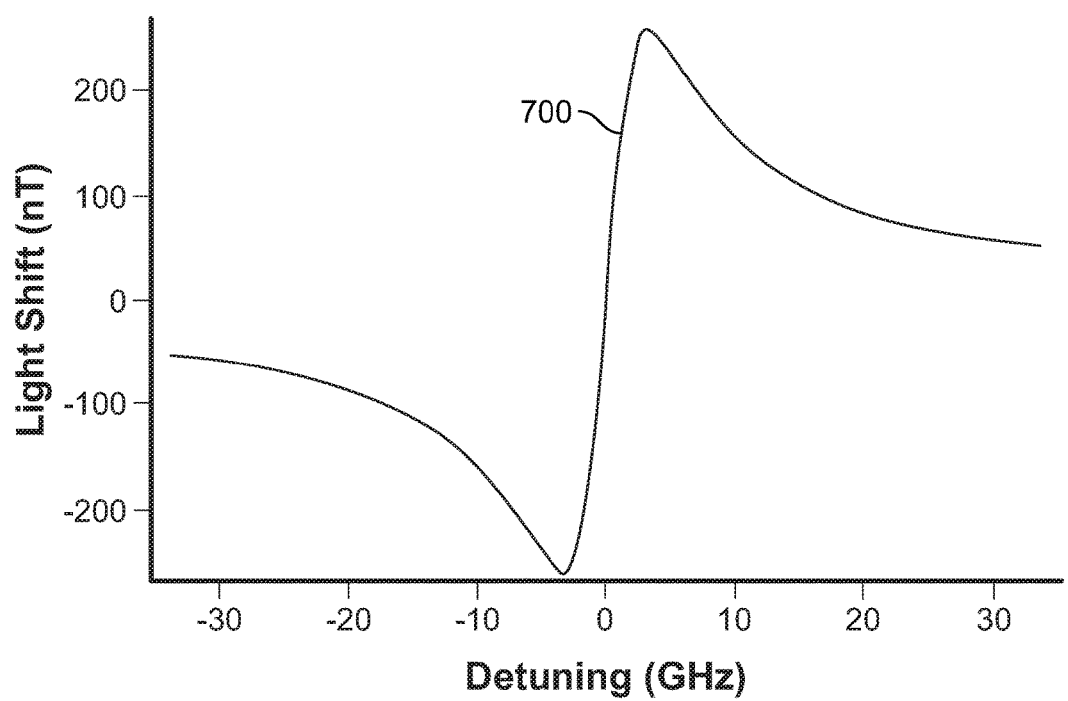
FIG. 7 is a diagram illustrating a light shift as a function of optical detuning for an atomic magnetometer.

FIG. 7 is a diagram illustrating a light shift as a function of optical detuning for an atomic magnetometer. In some embodiments, light shifts cause spurious shifts of the measured magnetic field. In the example shown, solid line 700 represents a light shift. The light shift shown in FIG. 7 is under the conditions of a 1 mW beam with a Gaussian profile and a 1 mm waist. A maximum light shift of well over 200 nT is observed.

Figure 8A:
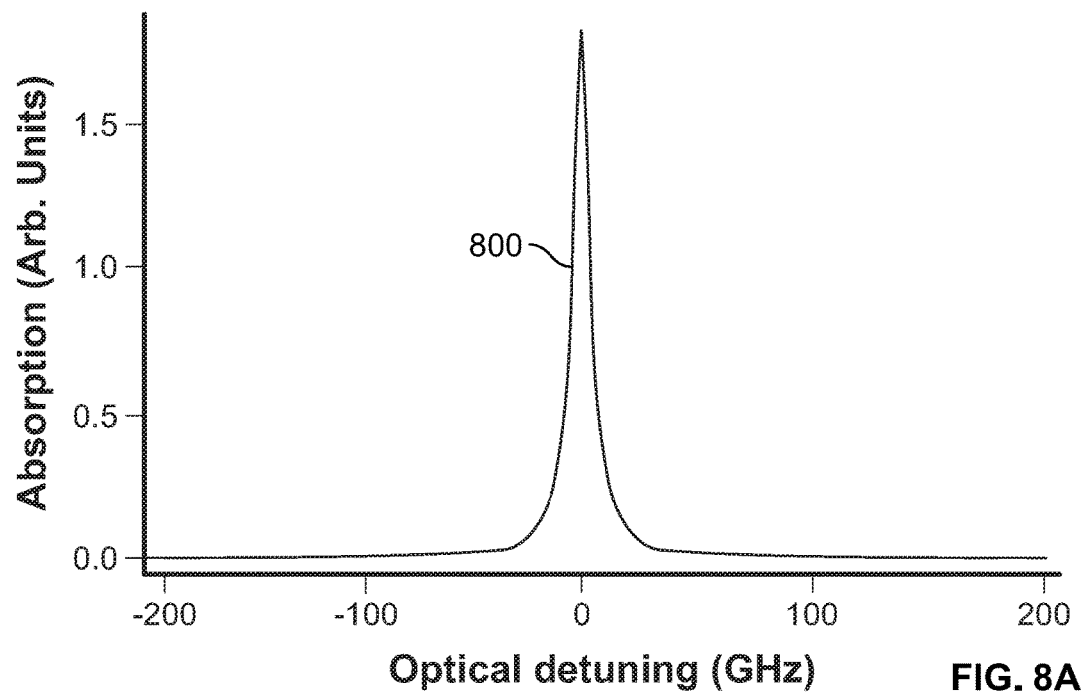
FIG. 8A is a diagram illustrating an embodiment of an optical absorption peak.

FIG. 8A is a diagram illustrating an embodiment of an optical absorption peak. In some embodiments, the absorption peak of FIG. 8A represents the optical absorption of an atomic vapor (e.g., atomic vapor 104 of FIG. 1). In the example shown, solid line 800 represents optical absorption (shown in arbitrary units) as a function of optical detuning (e.g., shift from a center frequency). In the example shown, the center frequency for optical detuning comprises the D1 transition frequency associated with the atomic vapor. In the example shown, the optical absorption peak is broadened by the presence of ~600 Torr of $N_2$ buffer gas. The optical absorption peak extends less than 50 GHz in each direction from the center frequency.

Figure 8B:
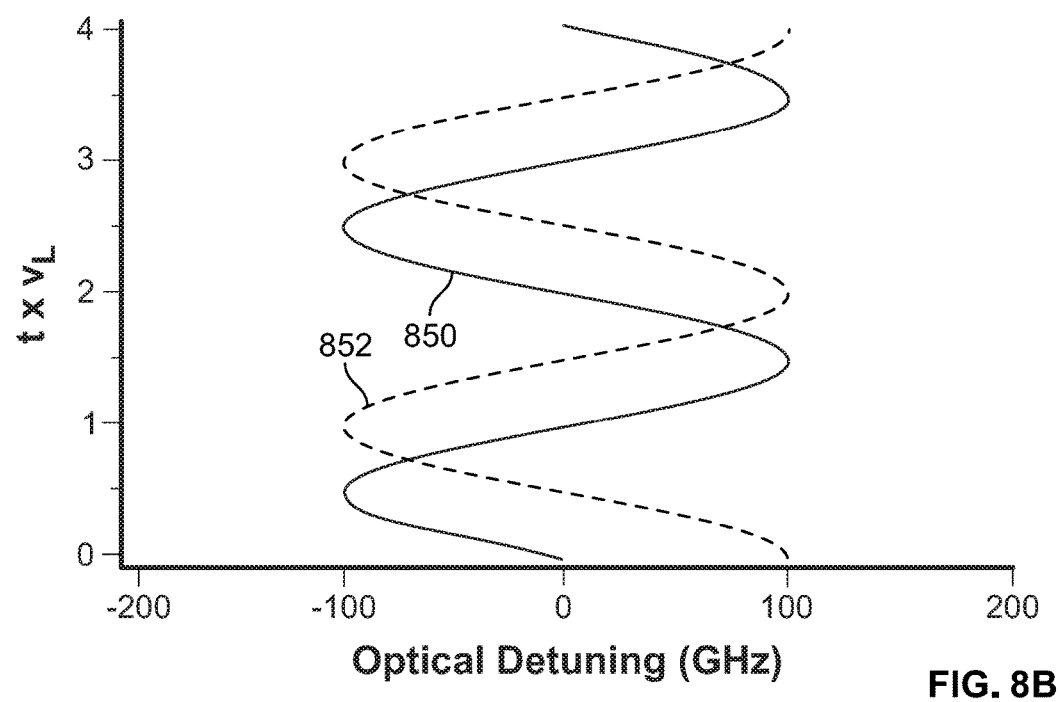
FIG. 8B is a diagram illustrating an embodiment of a modulation scheme.

FIG. 8B is a diagram illustrating an embodiment of a modulation scheme. In some embodiments, the modulation scheme of FIG. 8B comprises a modulation scheme for a push-pull atomic magnetometer (e.g., the atomic magnetometer of FIG. 2). In the example shown, solid line 850 represents optical modulation for a first pump laser (e.g., pump laser 200 of FIG. 2) and dashed line 852 represents optical modulation for a second pump laser (e.g., pump laser 202 of FIG. 2). In some embodiments, an optical modulation is applied to the optical frequency of each of the one or more pumping lasers of the atomic magnetometer. The first pump laser and the second pump laser are frequency modulated. In some embodiments, the light is frequency modulated symmetrically about the D1 transition frequency of the atomic vapor of the vapor cell of the atomic magnetometer. In the example shown, the optical frequency modulation depth is larger than the width of the D1 transition absorption peak associated with the vapor of the vapor cell (e.g., the peak extends less than plus or minus 50 GHz from the center frequency and the modulation is approximately plus or minus 100 GHz from the center frequency). The period of the optical frequency modulation seen in solid line 850 and dashed line 852 comprises approximately twice a Larmor precession period. In some embodiments, the optical frequency modulation period is equal to twice the Larmor precession period, generating optical pumping pulses that are coincident with the Larmor precession period. In some embodiments, the optical modulation applied to a first laser of the pumping lasers and the optical modulation applied to a second laser of the pumping lasers are out of phase by 90 degrees (e.g., the optical modulation seen in solid line 850 and dashed line 852 are out of phase by 90 degrees).

In some embodiments, the modulation scheme of FIG. 8B is designed to remove the effect of light shift as a function of optical detuning by sweeping the laser frequency across the entire detuning curve (e.g., solid line 700 of FIG. 7) during each modulation period. The effective light shift is the time-average light shift across the detuning curve. Because the light shift comprises an odd function as a function of detuning (i.e., the curve for negative detuning is the inverse of the curve for positive detuning), the total light shift is zero in the event that the central frequency of frequency modulated light is coincident with the center of the absorption profile. In some embodiments, in the event that the average optical detuning of each pump laser is shifted from its nominal value, a residual light shift is introduced due to the incomplete cancellation of the light-shift contributions at the extreme edges of the optical detuning modulation. This light shift is much smaller at large optical detuning, and the residual light shift is the difference in the small light shifts at plus or minus 100 GHz of optical detuning. For a spurious 1 GHz shift of the central frequency of one of the lasers, the residual light shift of the push-pull pumping scheme with frequency modulation at half the Larmor precession frequency is less than 0.1 nT. This is about 1000 times smaller than the full light shift for pumping at the Larmor precession frequency which is on the order of 100 nT.

Figure 9:
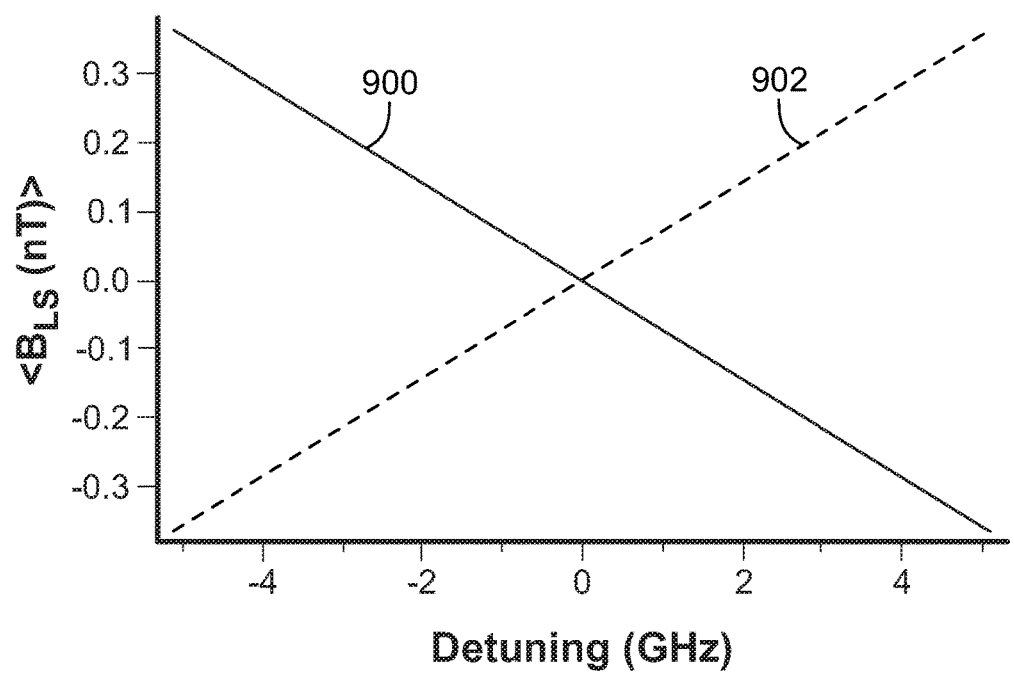
FIG. 9 is a diagram illustrating an embodiment of a time averaged light shift as a function of laser detuning for an atomic magnetometer using a modulation scheme.

FIG. 9 is a diagram illustrating an embodiment of a light shift as a function of laser detuning for an atomic magnetometer using a modulation scheme. In some embodiments, the diagram of FIG. 9 comprises a diagram illustrating light shift as a function of laser detuning for a push-pull atomic magnetometer using the modulation scheme of FIG. 8B. In the example shown, solid line 900 comprises a line indicating a time averaged light shift as a function of detuning for a first pump laser and solid line 902 comprises a line indicating a time averaged light shift as a function of detuning for a second pump laser. In the example shown, the time averaged light shift is linear in the optical detuning and measures less than 0.1 nT of light shift per GHz of optical detuning. Without the modulation scheme (e.g., in the diagram of FIG. 7) a 1 GHz detuning results in well over 100 nT of light shift.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An atomic magnetometer, comprising:
a vapor cell;
one or more pumping lasers, wherein the one or more pumping lasers are disposed to direct one or more laser beams through the vapor cell to interact with atoms of an atomic vapor in the vapor cell, wherein the atomic vapor periodically absorbs light of alternating circular polarization from the one or more laser beams;
a probe laser, wherein the probe laser is disposed to direct polarized light to pass through the vapor cell;
a sensor, wherein the sensor is disposed to intersect the polarized light from the probe laser after passing through the vapor cell for detecting a magnetometer signal, wherein the magnetometer signal is separated into an in-phase component and an out-of-phase component; and
a feedback circuit configured to correct for spurious detector phase shifts by measuring a sum of squares of the in-phase component and the out-of-phase component by changing an optical modulation frequency in order to drive the out-of-phase component of the magnetometer signal to zero, wherein the optical modulation frequency is modulated at a dithering frequency, and minimizing a deviation of the sum of the squares at the dither frequency.

2. The atomic magnetometer of claim 1, wherein the atomic vapor comprises a vapor of alkali metal atoms.

3. The atomic magnetometer of claim 1, wherein light of alternating circular polarization from the one or more laser beams comprises light of a first laser beam with a first circular polarization and light a second laser beam with a second circular polarization.

4. The atomic magnetometer of claim 3, wherein the second circular polarization is of an opposite circular polarization of the first circular polarization.

5. The atomic magnetometer of claim 1, wherein the interaction of atoms with the polarized light is at a frequency corresponding approximately to a Larmor precession frequency of the atoms of the atomic vapor.

6. The atomic magnetometer of claim 1, wherein the interaction of atoms with the polarized light is at a frequency corresponding approximately to a subharmonic of a Larmor precession frequency of the atoms of the atomic vapor.

7. The atomic magnetometer of claim 1, wherein the one or more pumping lasers includes at least two pumping lasers, and wherein the at least two pumping lasers are combined using at least one polarizing beam splitter.

8. The atomic magnetometer of claim 1, wherein the one or more pumping lasers includes at least two pumping lasers, and wherein the at least two pumping lasers are co-propagating.

9. The atomic magnetometer of claim 1, wherein an optical frequency modulation is applied to an optical frequency of a laser of the one or more pumping lasers to generate a frequency modulated light.

10. The atomic magnetometer of claim 9, wherein a center optical frequency of the frequency modulated light comprises an optical transition frequency associated with the atoms of the vapor cell.

11. The atomic magnetometer of claim 9, wherein an optical frequency modulation depth of the optical frequency modulation is broader than a width of an optical transition absorption peak associated with the atoms of the vapor cell.

12. The atomic magnetometer of claim 9, wherein a modulation period of the optical frequency modulation comprises approximately twice a Larmor precession period.

13. The atomic magnetometer of claim 9, wherein the optical frequency modulation applied to a first laser of the one or more pumping lasers and the optical frequency modulation applied to a second laser of the one or more pumping lasers are out of phase by 90 degrees.

14. The atomic magnetometer of claim 1, further comprising a mirror for reflecting the polarized light produced by the probe laser through the vapor cell a second time.

15. The atomic magnetometer of claim 1, wherein the sensor comprises a probe beam polarization detector comprising a polarizing beam splitter and a first photodiode and a second photodiode.

16. The atomic magnetometer of claim 15, wherein the magnetometer signal is determined by determining a difference between a first signal measured by the first photodiode and a second signal measured by the second photodiode.

17. The atomic magnetometer of claim 1, wherein the optical modulation frequency determined to drive the out-of-phase component of the magnetometer signal to zero comprises a scalar measurement of a magnetic field at a location of the vapor cell.

18. The atomic magnetometer of claim 1, wherein the optical modulation frequency is associated with one of the following: a frequency modulation of a pump laser of the one or more pump lasers, an amplitude modulation of the pump laser of the one or more pump lasers, or a polarization modulation of the pump laser of the one or more pump lasers.

19. The atomic magnetometer of claim 1, wherein a second atomic magnetometer laser beam of a second atomic magnetometer propagates in a direction perpendicular to a laser beam of the one or more laser beams of the atomic magnetometer.

20. The atomic magnetometer of claim 1, wherein the probe laser and the one or more pump lasers are arranged to produce light whose direction of propagation is nominally parallel or antiparallel.

21. A method for an atomic magnetometer, comprising:
disposing one or more pump lasers to direct one or more laser beams through a vapor cell to interact with atoms of an atomic vapor in the vapor cell, wherein the atomic vapor periodically absorbs light of alternating circular polarization from the one or more laser beams;
disposing a probe laser to direct polarized light to pass through the vapor cell; and
disposing a sensor to intersect the polarized light from the probe laser after passing through the vapor cell for detecting a magnetometer signal, wherein the magnetometer signal is separated into an in-phase component and an out-of-phase component; and
providing a feedback circuit configured to correct for spurious detector phase shifts by measuring a sum of squares of the in-phase component and the out-of-phase component by changing an optical modulation frequency in order to drive the out-of-phase component of the magnetometer signal to zero, wherein the optical modulation frequency is modulated at a dithering frequency, and minimizing a deviation of the sum of the squares at the dither frequency.

* * * * *